(12) United States Patent
Jaeger et al.

(10) Patent No.: US 11,606,072 B2
(45) Date of Patent: Mar. 14, 2023

(54) FILTER CIRCUIT

(71) Applicant: SNAPTRACK, INC., San Diego, CA (US)

(72) Inventors: Philipp Michael Jaeger, Munich (DE); Werner Ruile, Munich (DE)

(73) Assignee: SnapTrack, Inc., San Diego, CA (US)

( * ) Notice: Subject to any disclaimer, the term of this patent is extended or adjusted under 35 U.S.C. 154(b) by 1272 days.

(21) Appl. No.: 16/071,040

(22) PCT Filed: Nov. 29, 2016

(86) PCT No.: PCT/EP2016/079158
§ 371 (c)(1),
(2) Date: Jul. 18, 2018

(87) PCT Pub. No.: WO2017/125188
PCT Pub. Date: Jul. 27, 2017

(65) Prior Publication Data
US 2019/0028082 A1    Jan. 24, 2019

(30) Foreign Application Priority Data
Jan. 20, 2016  (DE) .................... 10 2016 100 925.3

(51) Int. Cl.
*H02K 23/60*    (2006.01)
*H03H 3/04*    (2006.01)
(Continued)

(52) U.S. Cl.
CPC ............. *H03H 3/04* (2013.01); *H03H 9/205* (2013.01); *H03H 9/605* (2013.01); *H03H 2003/0414* (2013.01); *H03H 2003/0471* (2013.01)

(58) Field of Classification Search
USPC .................... 310/116, 117, 118, 119, 365
See application file for complete search history.

(56) References Cited

U.S. PATENT DOCUMENTS

| 5,446,329 A | 8/1995 | Nakahata et al. |
| 6,300,708 B1 | 10/2001 | Itasaka |

(Continued)

FOREIGN PATENT DOCUMENTS

| CN | 1264505 A | 8/2000 |
| CN | 1677852 A | 10/2005 |

(Continued)

OTHER PUBLICATIONS

International Search Report and Written Opinion—PCT/EP2016/079158—ISA/EPO—dated Mar. 2, 2017.

*Primary Examiner* — Brian Ngo
(74) *Attorney, Agent, or Firm* — Patterson & Sheridan, LLP

(57) ABSTRACT

The present invention relates to a filter circuit (100) comprising a first and a second bulk acoustic wave resonator (2, 3), the first resonator (2) having a first piezoelectric layer (4) structured such that the first resonator (2) has a lower resonant frequency than the second resonator (3), wherein the first piezoelectric layer (4) is structured by recesses (14) passing through the first piezoelectric layer (4), the first resonator (2) and the second resonator (3) as series resonators (102, 105) connected in series with a signal path of the filter circuit (100) or wherein the first resonator (2) and the second resonator (3) as parallel resonators (103, 106) are connected to the signal path of the filter circuit (100) in such a way that in each case one electrode of the resonators is connected to the signal path.

20 Claims, 8 Drawing Sheets

(51) Int. Cl.
*H03H 9/205* (2006.01)
*H03H 9/60* (2006.01)

(56) References Cited

U.S. PATENT DOCUMENTS

| | | | |
|---|---|---|---|
| 9,497,551 B2 | 11/2016 | Ruile et al. | |
| 2008/0024042 A1* | 1/2008 | Isobe | H03H 9/173 |
| | | | 310/365 |
| 2015/0130560 A1* | 5/2015 | Yokoyama | H03H 9/587 |
| | | | 333/133 |

FOREIGN PATENT DOCUMENTS

| | | | | | |
|---|---|---|---|---|---|
| CN | 100547920 | C | * | 10/2009 | ............... H03H 3/02 |
| CN | 103973258 | A | * | 8/2014 | ......... H03H 9/02015 |
| DE | 60214948 | T2 | * | 1/2007 | ............. H03H 9/605 |
| DE | 102012111889 | B3 | * | 6/2014 | ............... B06B 1/06 |
| EP | 1895660 | A2 | * | 3/2008 | ........... H03H 9/0095 |
| EP | 2509221 | A1 | * | 10/2012 | ............... H03H 7/01 |
| JP | 2008072454 | A | | 3/2008 | |
| WO | 2014086524 | A2 | | 6/2014 | |
| WO | WO-2014086524 | A2 | * | 6/2014 | ............... B06B 1/06 |

* cited by examiner

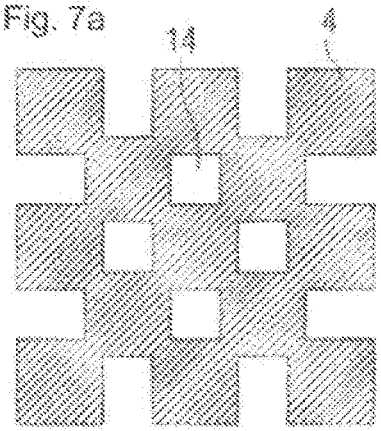
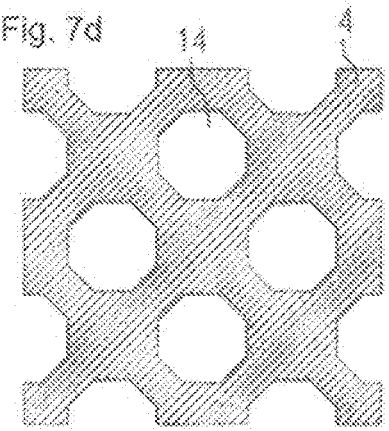
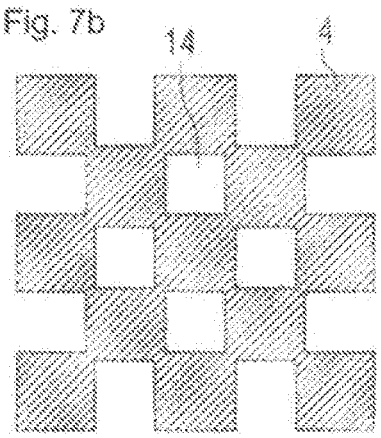
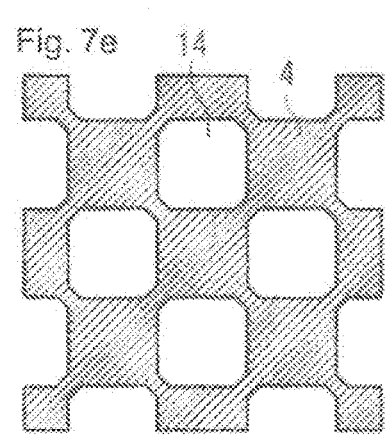
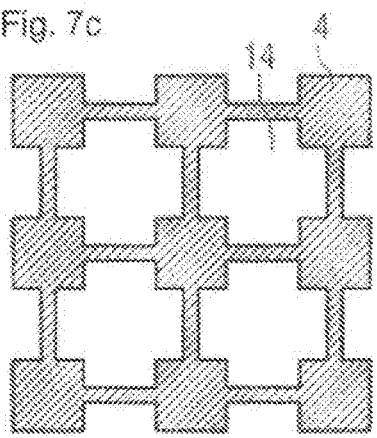
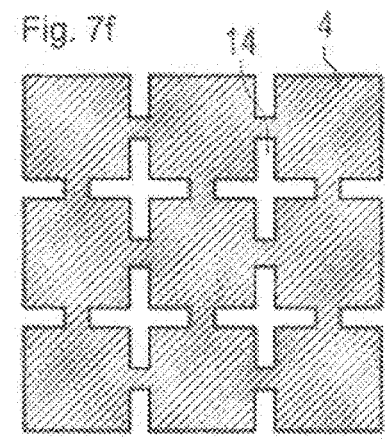

FILTER CIRCUIT

CROSS-REFERENCE TO RELATED APPLICATIONS

This application is a national stage application under 35 U.S.C. 371 of PCT/EP2016/079158, filed Nov. 29, 2016, which claims the benefit of German Patent Application Serial No. 102016100925.3, filed on Jan. 20, 2016, both of which are incorporated herein by reference in their entirety.

The present invention relates to a filter circuit comprising a plurality of bulk acoustic wave (BAW) resonators. The filter circuit may have at least two parallel resonators and/or at least two series of resonators.

In filter circuits, for example with a ladder-type topology or in the form of a bridge circuit, it is necessary that the series resonators and the parallel resonators differ in their resonance frequencies from each other. In the prior art, filter circuits having BAW resonators are known, in which the different resonance frequencies between the series resonators and the parallel resonators are realized in that the series resonators and the parallel resonators differ from one another in the thickness of their piezoelectric layers. The different layer thicknesses have to be precisely coordinated. The method for producing the resonators for such filter circuits is very complicated and requires several additional steps, in which the respective layer thicknesses are set by the application of so-called tuning layers in the desired manner. Another possibility known in the prior art for setting different resonance frequencies is that the series resonators and the parallel resonators differ in the thickness of another layer, this other layer being arranged in an acoustically active zone. For example, the other layer may be a metal electrode.

An optimization of the filter function of the filter circuits could in principle be achieved in that the series resonators are shifted among each other in their resonance frequencies and/or that the parallel resonators differ slightly in their resonance frequencies. However, a design of the filter circuit, in which the parallel resonators and/or the series resonators differ in their resonance frequencies from each other, employing a method known in prior art, wherein e.g. BAW resonators with different thicknesses of piezoelectric layers can be used, can only be realized with unreasonable costs involved.

In contrast, in circuits employing surface acoustic waves (SAW) resonators, it is possible to manufacture these resonators such that they differ in their respective resonant frequencies with significantly less cost. For this purpose, the SAW resonators can be designed differently in their lateral structuring. The adaptation of the lateral structuring of a SAW resonator can be carried out without additional technological manufacturing costs. Accordingly, in filter circuits with SAW resonators, it is possible to manufacture the series resonators relative to each other and/or the parallel resonators relative to each other in different resonant frequency without additional technological effort.

The object of the present invention is to provide a filter circuit having resonators that work with bulk acoustic waves, with a shift of the resonance frequencies of the series resonators and/or a shift of the resonance frequencies of the parallel resonators being enabled relative to each other. In this way, a filter circuit having resonant bulk acoustic wave resonators can be constructed, offering the same design freedom and filter function advantages as a filter circuit including SAW resonators.

This object is achieved by the filter circuit according to the present claim 1. The dependent claims disclose preferred embodiments of the invention.

A filter circuit is proposed which has a first and a second resonant bulk acoustic wave resonator, the first resonator having a first piezoelectric layer structured in a way that the first resonator has a lower resonant frequency than the second resonator, whereby the first piezoelectric layer is structured by recesses which pass through the first piezoelectric layer. The first resonator and the second resonator are connected either as series resonators in series with a signal path of the filter circuit, or the first resonator and the second resonator are connected as parallel resonators with the signal path of the filter circuit such that one electrode of the resonators is connected to the signal path respectively.

The recesses may extend in particular in a vertical direction through the first piezoelectric layer.

By structuring the piezoelectric layer of the first resonator by means of recesses in the piezoelectric layer, it is possible to design a filter formwork in which an adaptation of the resonant frequency of a resonator working with bulk acoustic waves can be made with little manufacturing effort. In particular, the filter circuit may comprise two parallel resonators with resonant frequency differing from each other and/or two series resonators with resonant frequency differing from each other. The structuring of the piezoelectric layers through recesses is much easier to implement in production than a different thickness of the piezoelectric layers, which is produced by the application of trim layers, or a different thickness of another layer, which is arranged in an acoustically active zone thus influencing the resonance frequency.

Accordingly, it now becomes possible to manufacture filter circuits having the same design degrees of freedom and an optimized filter function even with resonators operating with bulk acoustic waves, as is already known for resonators based on surface acoustic waves.

Moreover, in addition to a shift in the resonant frequency, the coupling factor of a resonant bulk acoustic wave resonator can also be increased if the resonator is structured by recesses. The coupling factor of an electro acoustic transducer describes the loss that occurs in the conversion between electrical energy and mechanical energy in the transducer. A high coupling factor allows a large bandwidth of the converter.

When shifting the coupling factor, the geometry and the arrangement of the recesses play a decisive role, which influence the coupling factor.

In particular, the first piezoelectric layer of the first resonator can be structured in such a way that, in the case of an electric field applied in a spatial direction, a vibration mode with vibrations in at least two spatial directions is induced. The induced vibration mode can in particular have vibrations in three spatial directions.

By inducing vibration modes with vibrations in at least two spatial directions, the coupling factor is increased. As described above, by structuring the respective piezoelectric layer, a desired coupling factor can be set in a targeted manner, resulting in greater design freedoms that can be used to optimize the filter function to the respective requirements. By structuring the resonators working with bulk acoustic waves and the associated increase in the respective coupling factor, it is possible to set both the resonant frequency and the pole-zero distance of the resonator independently from each other. This is possible for both the parallel and the series resonators of the filter circuit. On the other hand, such an independent choice of resonant frequency and pole-zero spacing is not possible with SAW resonators.

The induced vibrations can be described by a piezoelectric tensor. In an unstructured piezoelectric layer, only the diagonal elements of this tensor contribute to vibration, which is a pure vibration in the thickness direction. By structuring the piezoelectric layer with recesses, the non-diagonal elements of the tensor are also filled, so that oscillation modes in other spatial directions are also made possible.

Furthermore, the second resonator may comprise a second piezoelectric layer which is unstructured or which is structured by recesses which pass through the second piezoelectric layer. By structuring the second piezoelectric layer, the resonance frequency and the coupling factor of the second resonator can be set as desired. For the second piezoelectric layer of the second resonator, a different structuring can be selected than for the first piezoelectric layer of the first resonator.

In particular, the second piezoelectric layer of the second resonator can be structured in such a way that, in the case of an electric field applied in a spatial direction, a vibration mode with vibrations in at least two spatial directions is induced. It can thereby be achieved that the second resonator has a high coupling factor and, accordingly, the conversion losses are kept as low as possible.

The first piezoelectric layer and the second piezoelectric layer may have the same thickness. If the filter circuit has resonators whose piezoelectric layers have the same thickness, then these resonators can be manufactured simultaneously in a common production method. In particular, trimming layers which are intended to subsequently adapt the thickness of the resonators can be dispensed with and the production process is considerably simplified. Instead of causing certain properties by different thicknesses of the resonators, it is proposed here to structure the piezoelectric layers of the resonators differently to each other and thus to realize the desired properties, such as different resonance frequencies of two parallel resonators to each other and/or two series resonators to each other and certain coupling factors.

The filter circuit may be a ladder-type circuit or a bridge circuit. The filter circuit may be a bandpass filter or a bandstop filter. Both a bandpass filter and a bandstop filter can be formed with a ladder-type topology or the topology of a bridge circuit.

The first and the second resonator can be a film bulk acoustic resonator (FBAR) or a solid mounted bulk acoustic resonator (SMR). A film bulk acoustic resonator is arranged in a freely oscillating manner, wherein a cavity is located below the resonator. A solid mounted resonator is arranged on an acoustic mirror.

The recesses can be formed in particular by a photo lithographic patterning of the respective piezoelectric layer. This step can be carried out as one of the last manufacturing steps in a simple manner. In this case, a plurality of resonators can be provided simultaneously with mutually different recesses, so that different shifts of the respective resonant frequency can be realized in a single manufacturing step.

Furthermore, the filter circuit can be arranged on a single chip. In particular, at least two parallel resonators and at least two series resonators can be arranged on the chip.

Furthermore, the filter circuit may have at least one third bulk acoustic wave resonator and a fourth bulk acoustic wave resonator.

The first resonator and the third resonator may be serially connected as series resonators with the signal path of the filter circuit. The second resonator and the fourth resonator can be connected as parallel resonators with the signal path of the filter circuit such that in each case one electrode of the resonators is connected to the signal path. Accordingly, the filter circuit may comprise at least two parallel resonators and at least two series resonators.

The third resonator may include a third piezoelectric layer structured such that the third resonator has a lower resonant frequency than the fourth resonator, the third piezoelectric layer being structured by recesses passing through the first piezoelectric layer. In particular, all four resonators may each have a piezoelectric layer, wherein these layers are each structured such that each resonator has a different resonance frequency.

The piezoelectric layers of the first resonator, the second resonator, the third resonator and the fourth resonator may further have the same thickness.

The invention is explained in more detail below with reference to the figures.

FIGS. 7a to 7f, 8, 9a, 9b, 10, and 11 show additional exemplary embodiments of structured piezoelectric layers, respectively in a top view of the xy plane.

The present invention relates to a filter circuit having a plurality of bulk acoustic wave resonators differing in resonant frequencies from each other. These resonators may be at least two parallel resonators, which differ in their resonant frequency, and/or at least two series resonators, which differ in their resonant frequency.

Here, a resonator that is connected in series in a signal path is referred to as a series resonator. Here, a resonator whose one electrode is connected to a node arranged in the signal path and whose other electrode is not connected to the signal path is referred to as a parallel resonator.

Figure 1:
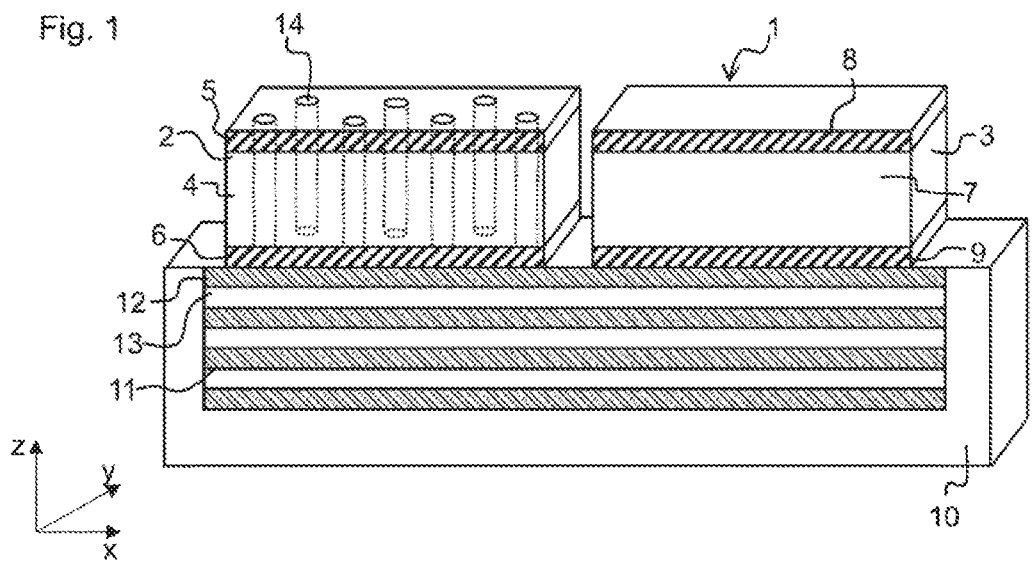
FIG. 1 shows a cross section through a filter chip of a BAW resonator of the SMR type.

FIG. 1 shows a chip 1 which has two resonators. The chip 1 comprises a first resonator 2 operating by means of acoustic bulk waves and a second resonator 3 operating by means of acoustic bulk waves. The first resonator 2 and the second resonator 3 may, for example, be a first parallel resonator and a second parallel resonator of a filter circuit. Alternatively, the first resonator 2 and the second resonator 3 may be a first series resonator and a second series resonator of a filter circuit.

The first resonator 2 operating by means of acoustic bulk waves has a first piezoelectric layer 4, which is arranged between an upper electrode 5 and a lower electrode 6. Furthermore, the second resonator 3 operating by means of acoustic bulk waves also has a second piezoelectric layer 7, which is arranged between an upper electrode 8 and a lower electrode 9. The lower electrodes 6, 9 are respectively arranged on the side, oriented towards a chip substrate 10, of the respective piezoelectric layer 4, 7. The upper electrodes 5, 8 are respectively arranged on the side, oriented away from the chip substrate 10, of the respective piezoelectric layer 4, 7.

The first and the second resonator 2, 3 have an identical thickness. In particular, the first piezoelectric layer 4 is as thick as the second piezoelectric layer 7. The first and the second piezoelectric layer 4, 7 can respectively contain aluminum nitride or consist of aluminum nitride.

The first and the second resonator 2, 3 are arranged on a common chip substrate 10. The chip substrate contains silicon. Below the two resonators 2, 3, an acoustic mirror 11 may be formed. The acoustic mirror 11 has alternately arranged first layers 12 and second layers 13, wherein the second layers 13 differ in their acoustic impedance from the first layers 12. The acoustic mirror 11 consists, for example, of alternately arranged layers made of $SiO_2$ and tungsten.

The first piezoelectric layer 4 is structured. The piezoelectric layers 4 were structured in a photolithography process. The structuring includes recesses 14, which extend through the piezoelectric layers 4. In this case, the recesses 14 extend in the vertical direction. Here, the recesses 14 are grooves. The recesses 14 are tubular recesses with a circular section. Alternatively or additionally, the recesses 14 may also have holes whose cross-section changes in the vertical direction and/or which do not extend through the entire thickness of the piezoelectric layers 4.

In FIG. 1, the z direction denotes the direction that is defined by the surface normal of the electrodes 5, 6, 8, 9. This direction is called the vertical direction. The extensions 14 extend in the z direction. The y direction is perpendicular to the vertical direction. The x direction is orthogonal to the y direction and orthogonal to the z direction. Both the y direction and the x direction are referred to as lateral directions. FIG. 1 thus shows chip 1 in a cross section through the xz plane.

The structuring of the piezoelectric layer 4 results in the shifting of the resonance frequency of the first resonator 2. In particular, the resonance frequency of the first resonator 2 is reduced the more, the stronger the first piezoelectric layer 4 is structured. Stronger structuring in this respect is equivalent to more material of the first piezoelectric layer 4 having been removed. By the structuring of the first piezoelectric layer 4 of the first resonator 2, the latter has a lower resonance frequency than the second resonator 3.

Figure 2:
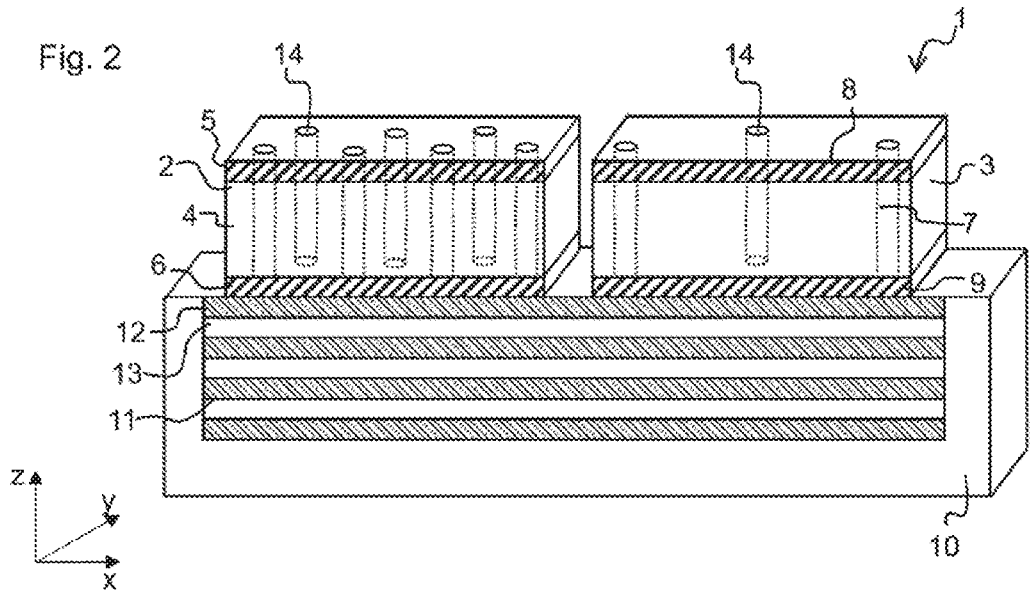
FIG. 2 shows another cross section through a filter chip of a BAW resonator of the SMR type.

FIG. 2 shows another chip 1, which differs from the chip 1 shown in FIG. 1 only in that the second piezoelectric layer 7 is also structured in the chip 1 shown in FIG. 2. The second piezoelectric layer 7 was in this case structured in a photolithography process. In particular, the first and the second piezoelectric layer were structured using a photolithography process in a common method step. The second piezoelectric layer 7 also comprises recesses 14, which extend in the vertical direction through the second piezoelectric layer 7. The second piezoelectric layer 7 is less strongly structured than the first piezoelectric layer 4, i.e. during the structuring, more material was removed from the first piezoelectric layer 4 than from the second piezoelectric layer 7. For this reason, the first resonator 2 has a lower resonance frequency than the second resonator 3.

The recesses 14 are not filled, both in the exemplary embodiment shown in FIG. 1 as well as in the exemplary embodiment shown in FIG. 2. In alternative exemplary embodiments, they can be completely filled with a filling layer. Alternatively, only their inside can be covered with a cladding layer. The filling layer and/or the cladding layer can contain a material that exhibits an abnormal thermomechanical behavior. This material compensates for the normal thermomechanical behavior of the respective piezoelectric layer 4, 7. In particular, the material can stiffen during heating as a result of the abnormal thermomechanical behavior.

Furthermore, the filling layer and/or the cladding layer can protect the respective piezoelectric layer 4, 7 against environmental impacts. For example, the filling layer and/or the cladding layer can ensure passivation.

In a further embodiment, four resonators can be arranged on the chip 1. These may be two parallel resonators and two series resonators, which are interconnected to form a filter circuit. The four resonators can have the same thickness and differ in their structuring from each other. Accordingly, they can differ from each other in their resonance frequencies.

Figure 3:
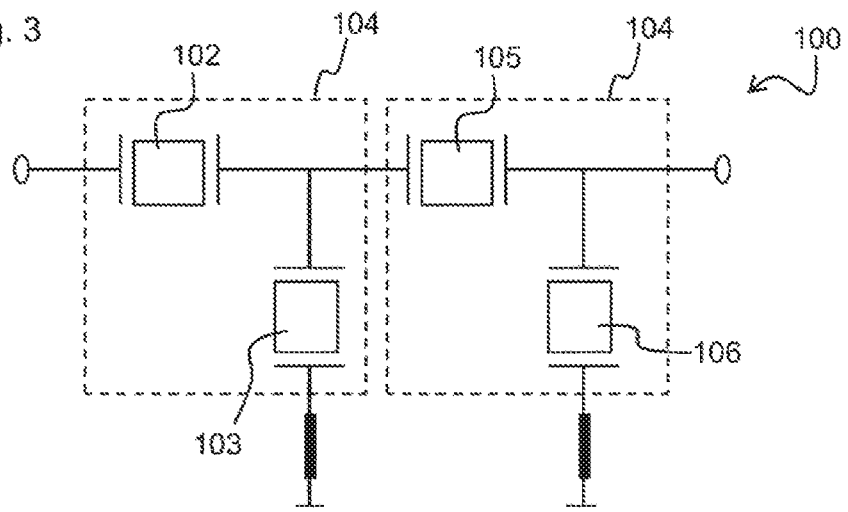
FIG. 3 shows a filter circuit with a ladder-type topology.

FIG. 3 shows a first exemplary embodiment of the filter circuit 100. The filter circuit 100 is a ladder-type circuit. Such a circuit can be designed either as a bandpass filter or as a bandstop filter. First, a ladder-type circuit forming a bandpass filter is considered.

The ladder-type circuit has a signal path 101 with a signal path input and a signal path output. A first series resonator 102 is connected in series in the signal path 101. A parallel resonator 103 is interconnected such that an electrode of the parallel resonator 103 is interconnected with the signal path 101 and the other electrode of the parallel resonator 103 is connected to ground via a reactance element. The first series resonator 102 and the first parallel resonator 103 form a ladder-type circuit base element 104.

The first parallel resonator 103 has a lower resonance frequency than the first series resonator 102. Further, the characteristic pass frequency of the first series resonator 102 is approximately equal to the stop frequency of the first parallel resonator 103. Thus, the base element 104 forms a bandpass filter. The right flank of the attenuation characteristic of the passband is essentially determined by the specific design of the first series resonator 102, while the left side is largely determined by the design of the first parallel resonator 103.

The ladder-type circuit is made up of a plurality of series-connected base elements 104, each base element 104 essentially consisting of a series resonator and a parallel resonator. For example, a second base element 104 has a second series resonator 105 and a second parallel resonator 106.

The first parallel resonator 103 and the second parallel resonator 106 differ from each other in their resonance frequency. The first parallel resonator 103 has a first piezoelectric layer. The second parallel resonator 106 has a second piezoelectric layer. The first piezoelectric layer of the first parallel resonator 103 is structured differently than the second piezoelectric layer of the second parallel resonator 106. The piezoelectric layers are, as described above, structured with recesses 14 which extend through the respective piezoelectric layers. The different structuring results in different resonance frequencies.

Also, the first series resonator 102 and the second series resonator 105 may differ from each other in their resonant frequency. This can be made possible in that a first piezoelectric layer of the first series resonator 102 is structured differently than a second piezoelectric layer of the second series resonator 105. The piezoelectric layers are, as described above, structured with recesses 14 which extend through the respective piezoelectric layers.

Only the displacement of the resonant frequency by the structuring of the piezoelectric layers described here makes it possible for a filter circuit 100, which has filters working with bulk acoustic waves, to easily shift the resonant frequencies of the parallel and/or series resonators 102, 103, 105, 106 relative to one another. This makes it possible to optimize the filter function of the filter circuit 100. For example, the poles of the parallel resonators 103, 106 and the zeros of the series resonators 102, 105 can be shifted relative to each other, so that the slope of the frequency characteristic of the filter circuit 100 can be optimized and the suppression of signals whose frequency is outside the pass band is improved.

In another embodiment, the ladder-type circuit may form a bandstop filter. In this case, the series resonators 102, 105 have a lower resonance frequency than the parallel resonators 103, 106. Again, the series resonators 102, 105 and/or the parallel resonators 103, 106 may each differ in their resonant frequency. For this purpose, the piezoelectric layers of the series resonators 102, 105 and/or the parallel resonators 103, 106 can be structured differently from one another.

Figure 4:
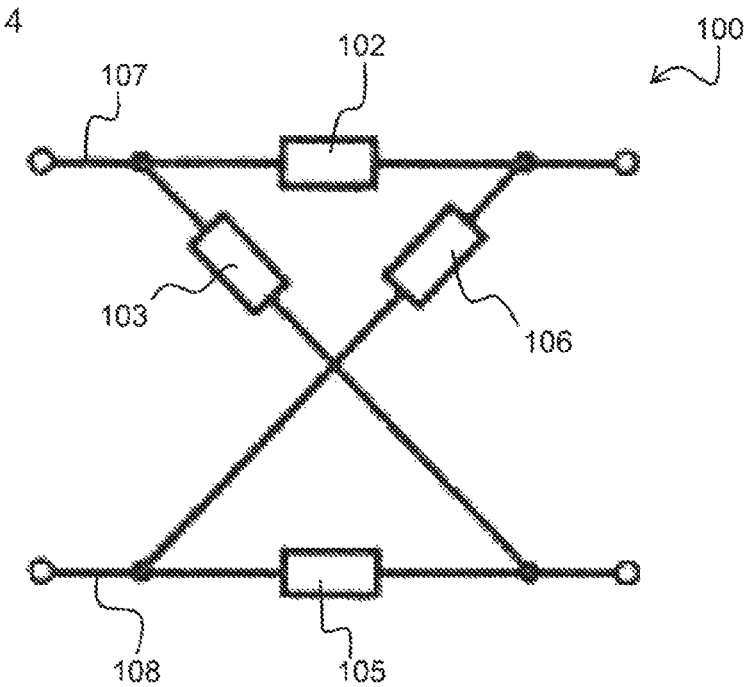
FIG. 4 shows a filter circuit which is constructed as a bridge circuit.

FIG. 4 shows a second exemplary embodiment of the filter circuit 100. The filter circuit 100 according to the second embodiment is a bridge circuit.

The bridge circuit has a first signal path 107, which connects a first signal input to a first signal output, and a second signal path 108, which connects a second signal input to a second signal output. In the first signal path 107, a first series resonator 102 is connected in series.

In the second signal path 107, a second series resonator 105 is connected in series. A first parallel resonator 103 is connected to a first node, which is arranged in the first signal path 107 between the first signal input and the first series resonator, and to a second node, which is arranged in the second signal path 108 between the second signal output and the second series resonator 105. A second parallel resonator 106 is connected to a third node, which is arranged in the first signal path 107 between the first series resonator 102 and the first signal output, and to a fourth node, which is arranged in the second signal path 108 between the second series resonator 105 and the second signal input.

The first parallel resonator 103, the second parallel resonator 106, the first series resonator 102 and the second series resonator 105 are resonators operating with bulk acoustic waves, each having a piezoelectric layer, the piezoelectric layers differing from each other in their structuring and thus in their resonant frequencies.

The bridge circuit may be designed as a bandpass filter or as a bandstop filter, depending on how the resonant frequencies of the resonators 102, 103, 105, 106 are selected.

Figure 5:
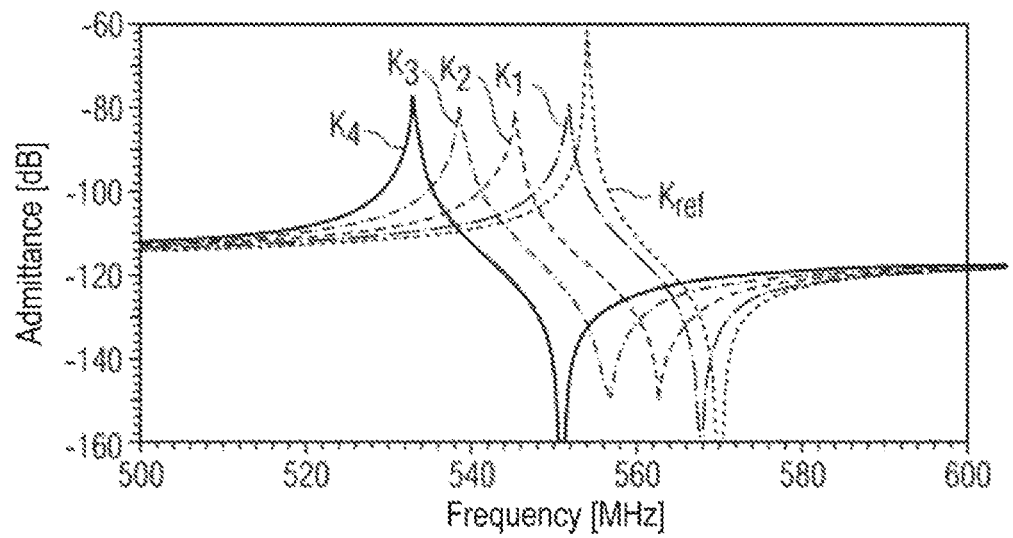
FIG. 5 shows a diagram, in which the amplitude of the admittance is plotted for different resonators on a logarithmic scale.

FIG. 5 shows the effects of the structuring on the frequency behavior of one resonator 2. 102, 103, 105, 106 in a diagram. In this case, the frequency is plotted in MHz on the abscissa. On the axis of ordinates, the amplitude of the admittance is plotted on a logarithmic scale.

FIG. 5 first shows a reference curve $K_{ref}$, which shows the frequency behavior of a resonator with an unstructured piezoelectric layer. Furthermore, FIG. 5 shows the curves $K_1$, $K_2$, $K_3$, and $K_4$, which respectively describe the frequency behavior of a resonator with a structured piezoelectric layer, wherein the respective piezoelectric layer in this case is structured with holes and the diameter of the holes respectively increases from curve $K_1$ to curve $K_4$.

It can be seen from FIG. 5 that the resonance frequency and the antiresonance frequency of the resonators 2 can be shifted downward by structuring the respective piezoelectric layer 4. In doing so, this shift is the larger, the stronger the piezoelectric layer 4 is structured, i.e. the more material was removed from the piezoelectric layer 4.

Figure 6:
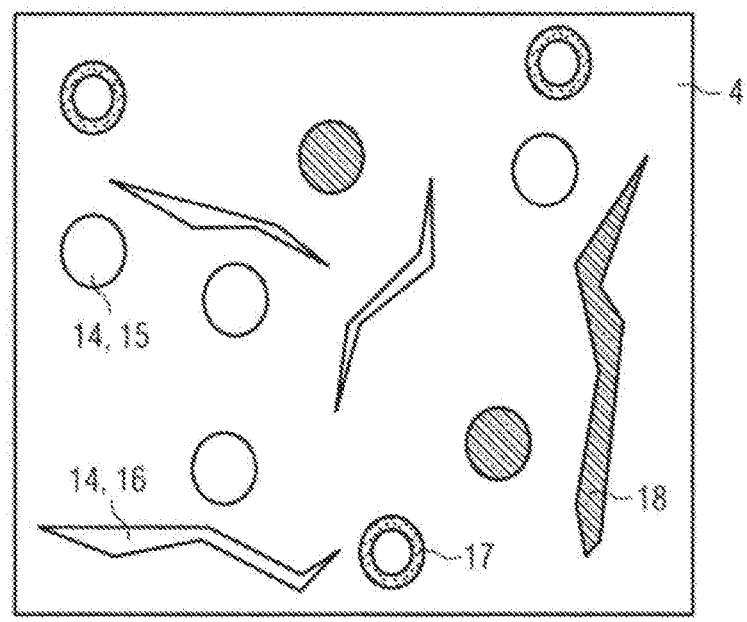
FIG. 6 shows a first exemplary embodiment of a structured piezoelectric layer in a top view of the xy plane.

Furthermore, FIG. 5 shows that the pole-zero distance of the resonators 2 becomes larger, the stronger the piezoelectric layer 4 is structured. The pole-zero distance of a resonator 2 is defined as the distance between the resonance frequency and the antiresonance frequency. FIG. 6 shows a top view of the xy plane of a piezoelectric layer 4, in which the recesses form randomly arranged holes 15 and slots 16. The holes 15 and the slots 16 extend in the vertical direction through the piezoelectric layer 4. The piezoelectric layer can be the first piezoelectric layer 4. As described above, the second piezoelectric layer 7 can either remain unstructured or be structured in a similar manner as, but to a lesser degree than, the first piezoelectric layer 4.

Some holes 15 are covered by a cladding layer 17, which exhibits an abnormal thermomechanical behavior. This cladding layer 17 counteracts the normal thermomechanical behavior of the piezoelectric layer 4. A partial compensation, a complete compensation, or an overcompensation is thereby possible. The side walls of the slots 16 could also be covered by the cladding layer 17.

Furthermore, some of the holes 15 and some of the slots 16 are filled with a filling layer 18 made of a dielectric material, which exhibits an abnormal thermomechanical behavior. For this purpose, any material that exhibits an abnormal thermomechanical behavior can be used.

Furthermore, some of the holes 15 and slots 16 remain free of the cladding layer 17 and the filling layer 18.

FIGS. 7a through 7f show additional exemplary embodiments of a structured piezoelectric layer 4. In this case, the FIGS. 7a through 7f show the piezoelectric layer 4 in a top view of the xy plane. As in the following figures, the piezoelectric layer in this case can also be the first or the second piezoelectric layer 4, 7.

In this case, recesses 14 extend in the vertical direction through the piezoelectric layers 4 shown. The respective piezoelectric layer 4 is structured into blocks by these recesses 14. If the recesses 14 are designed with a sufficiently small diameter, the corners of the blocks overlap as shown in FIG. 7a and FIG. 7b. If a larger diameter of the recesses 14 is chosen, the piezoelectric layer 4 is structured into blocks that are connected to one another with webs as shown in FIGS. 7c through 7f. In some exemplary embodiments, a web connects every two blocks at their ends as shown in FIG. 7d and FIG. 7e. In other exemplary embodiments, the blocks are connected to one another by webs on their lateral surfaces as shown in FIG. 7c and FIG. 7f.

Figure 8:
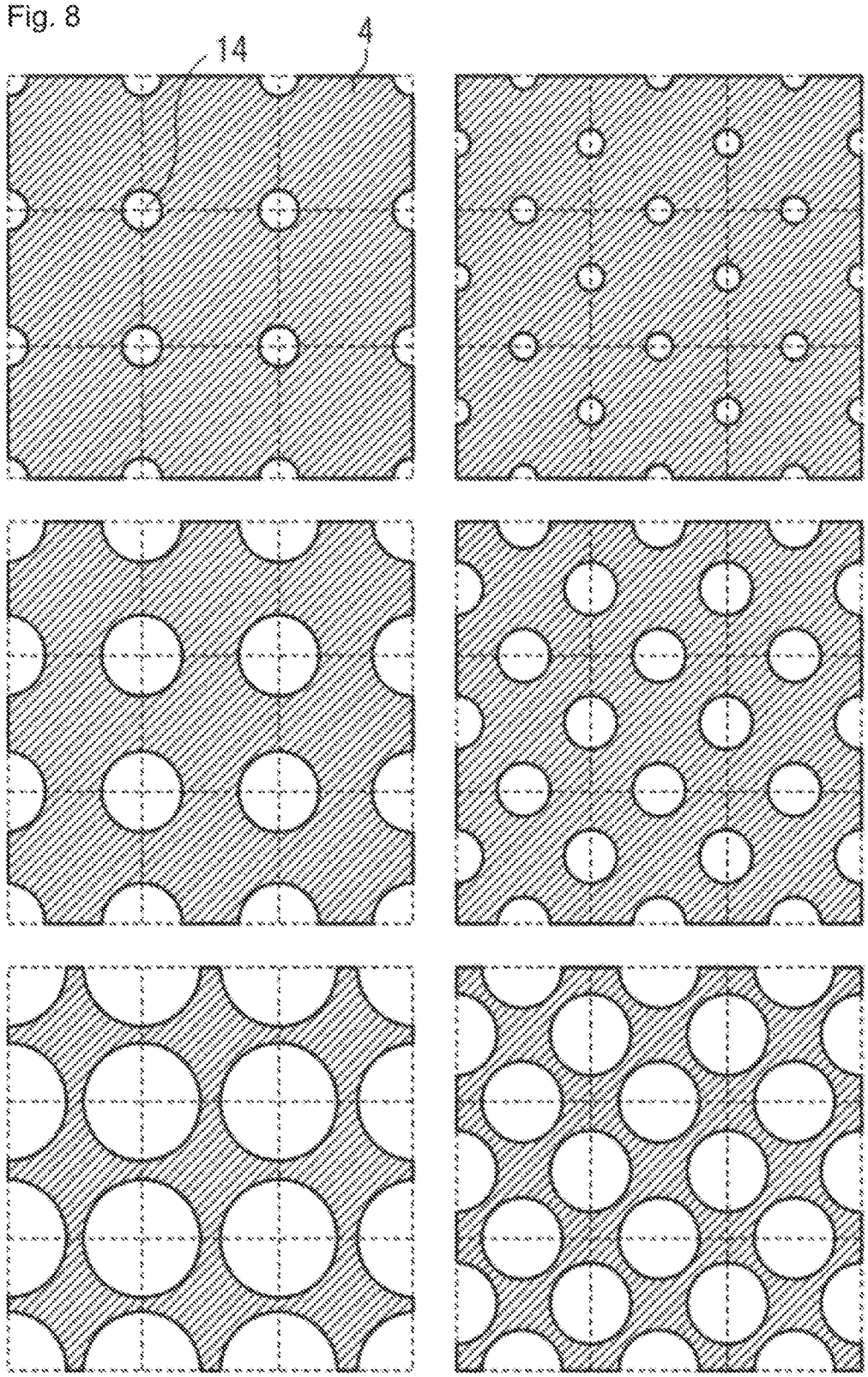

FIG. 8 shows additional exemplary embodiments of a structured piezoelectric layer 4, which is also illustrated in this case in a top view of the xy plane. The piezoelectric layers 4 shown in FIG. 8 are structured by recesses 14 with a circular cross section. In the different illustrations of FIG. 8, the recesses 14 have different diameters. The larger the diameter of the recess 14 is, the stronger the resonance frequency is reduced and the larger the pole-zero distance of the resonator 2 becomes.

The diameters of the recesses 14 can, for example, be between 0.2 and 6 µm.

Figure 9A:
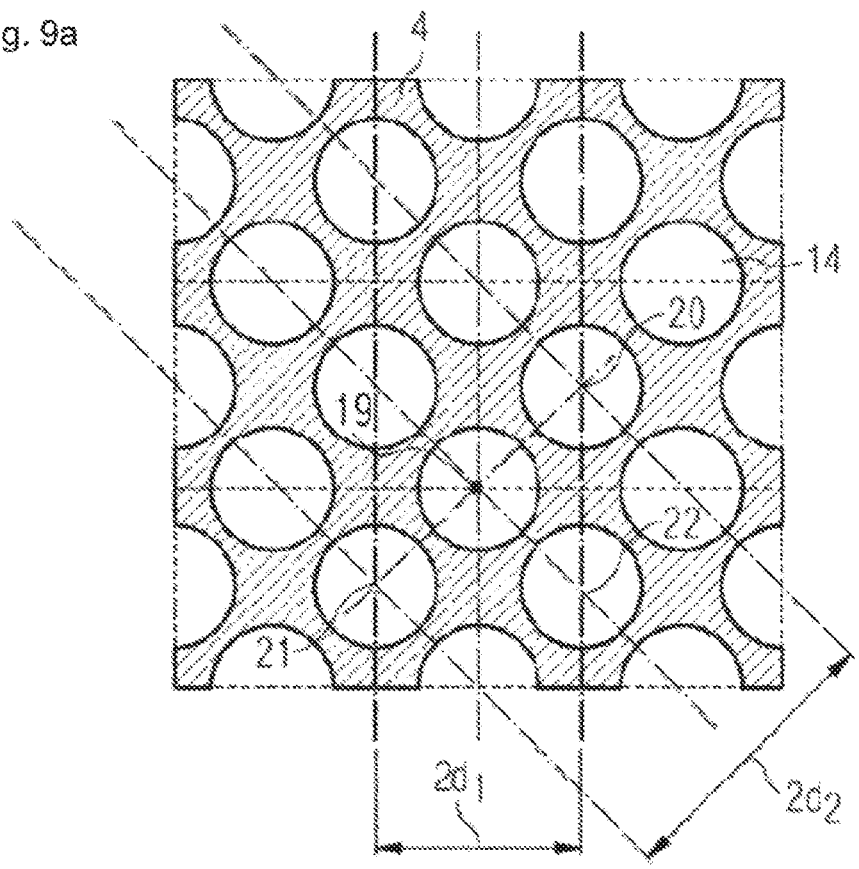
Figure 9B:
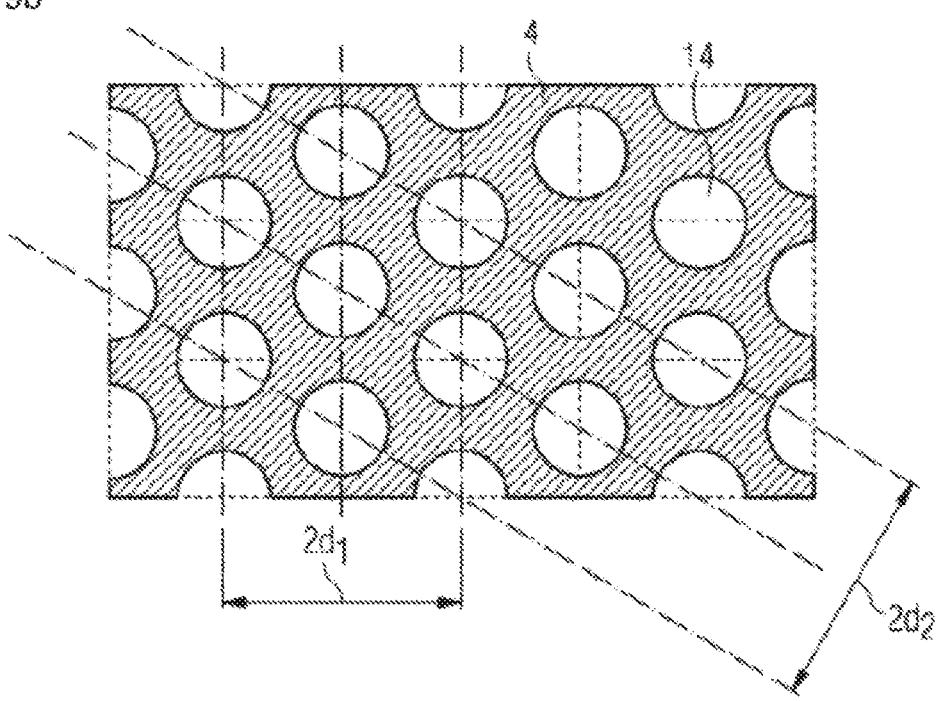

FIG. 9a and FIG. 9b show two additional exemplary embodiments of a structured piezoelectric layer 4. The piezoelectric layers 4 are also shown in a plan view of the xy plane in FIGS. 9a and 9b. The piezoelectric layers 4 are respectively structured by recesses 14 with a circular cross section. The piezoelectric layers 4 are respectively structured such that a phononic bandgap structure is formed. The phononic bandgap structure in particular ensures that emission losses in the lateral direction can be minimized.

In the vertical direction (z direction), the acoustic mirror in SMR resonators and the free edge condition in FBAR resonators ensures reflections of the acoustic wave and thus a minimization of the losses. If furthermore a two-dimensional phononic bandgap structure is formed, it minimizes the emission losses in the lateral direction.

The recesses 14 are arranged in columns and rows, wherein the columns extend in the y direction. The recesses 14 of two neighboring columns are, in this case, offset from one another. The recesses are arranged periodically to form columns such that the arrangement of the recesses 14 of two columns, between which exactly one additional column is arranged, is identical.

As shown in FIG. 9a, $d_2$ denotes the distance of the centers 19, 20 of two recesses 14, wherein the first recess 14 is arranged in a first column and the other recess 14 is arranged in the directly neighboring column and is nearest to the first recess 14. Furthermore, $2d_1$ denotes the spacing of the centers 21, 22 of two recesses 14, wherein the first recess 14 is arranged in a first column and the other recess 14 is located in the closest column with an identical recess arrangement, and in this column closest to the first recess. A phononic bandgap structure is formed if $d_1$ and $d_2$ fulfill the following condition:

$$d_2/d_1 = \sqrt{2}$$

A phononic bandgap structure can also be obtained more easily or in a better way by means of other design specifications. An example in this respect is illustrated in FIG. 9b. $2d_1$ and $2d_2$ are thereby defined as shown in FIG. 9b. A phononic bandgap structure is obtained if $d_1$ and $d_2$ fulfill the following condition:

$$d_2/d_1 = 0.5 \times \sqrt{3}$$

This is also called a hexagonal arrangement in this context.

Figure 10:
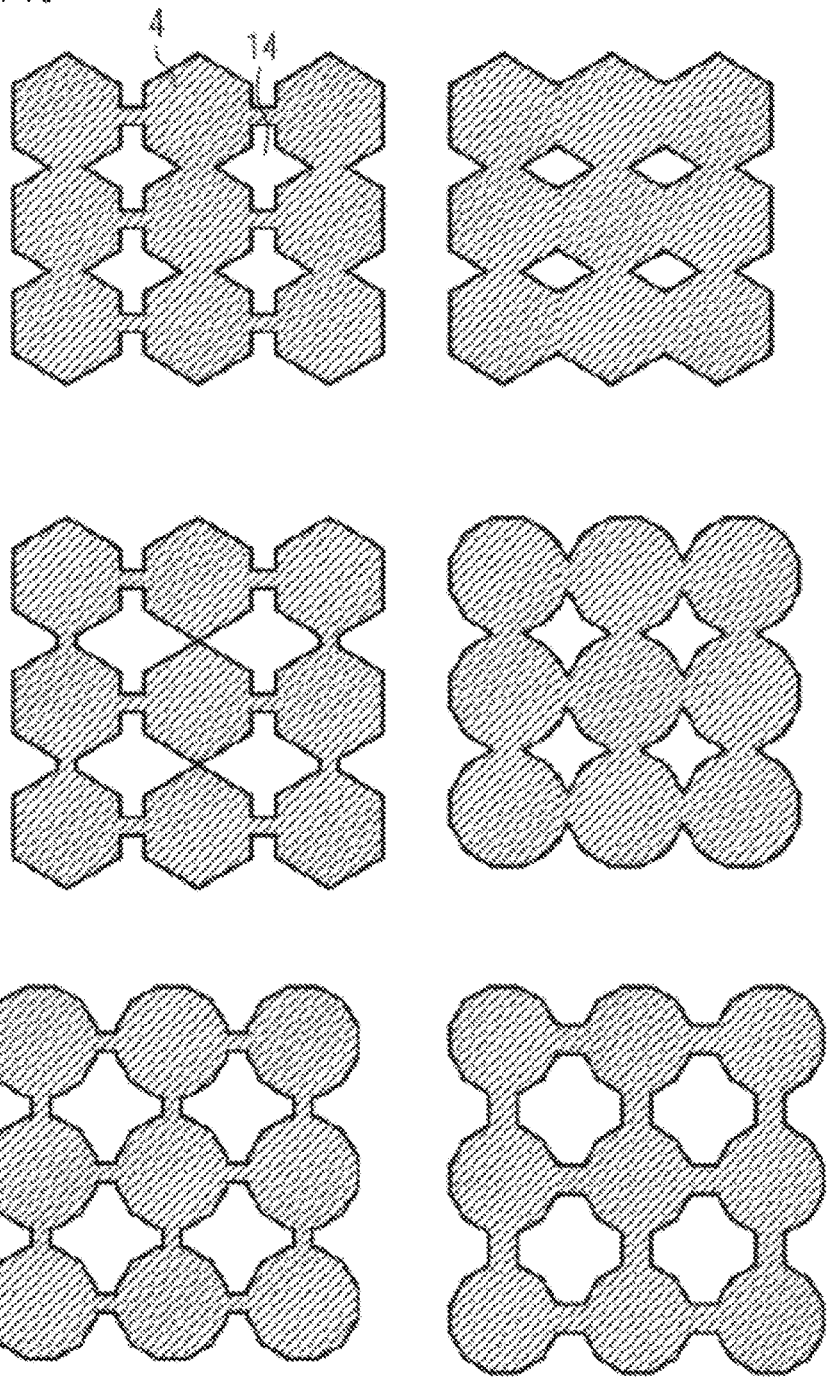

FIG. 10 shows additional exemplary embodiments of structured piezoelectric layers 4, wherein the piezoelectric layers 4 are respectively structured to form blocks with hexagonal or dodecagonal base surfaces. In some of the exemplary embodiments shown, these blocks transition into one another; in other exemplary embodiments, they are connected to one another via webs.

Figure 11:
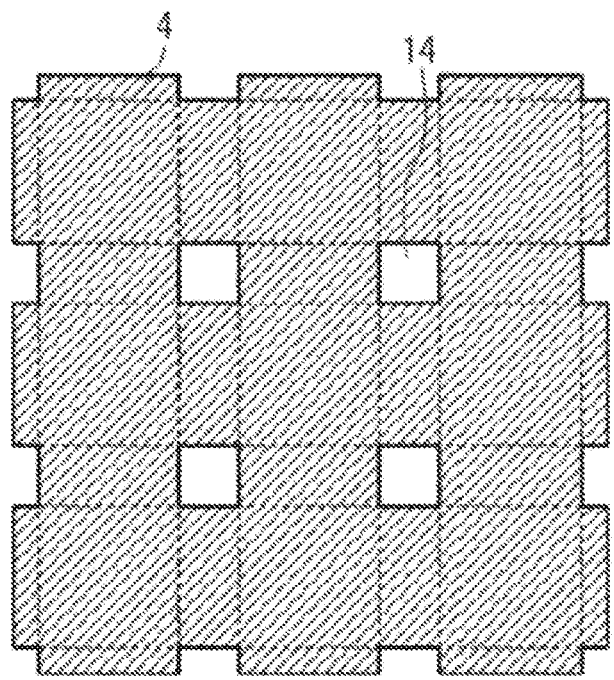

FIG. 11 shows another exemplary embodiment of a structured piezoelectric layer 4. The piezoelectric layer is structured to form blocks with a square base surface. The lateral surfaces of the blocks are connected to one another via webs, wherein the webs have a width that matches the lateral length of the blocks.

LIST OF REFERENCE SIGNS

1 Chip
2 First resonator
3 Second resonator
4 First piezoelectric layer
5 Top electrode
6 Bottom electrode
7 Second piezoelectric layer
8 Top electrode
9 Bottom electrode
10 Chip substrate
11 Acoustic mirror
12 First layer of the acoustic mirror
13 Second layer of the acoustic mirror
14 Recess
15 Hole
16 Slot
17 Cladding layer
18 Filling layer
19 Center
20 Center
21 Center
22 Center
100 Filter circuit
101 Signal path
102 First series resonator
103 First parallel resonator
104 Base element
105 Second series resonator
106 Second parallel resonator
107 First signal path
108 Second signal path

The invention claimed is:

1. A filter circuit, comprising
a first and a second bulk acoustic wave (BAW) resonator, the first BAW resonator having a first piezoelectric layer structured such that the first BAW resonator has a lower resonant frequency than the second BAW resonator, wherein the first piezoelectric layer has a plurality of recesses formed in the first piezoelectric layer, wherein at least one of the plurality of recesses extends through an entirety of a thickness of the first piezoelectric layer and at least one of the recesses does not extend through the entirety of the thickness of the first piezoelectric layer, and wherein:
the first BAW resonator and the second BAW resonator are series resonators that are connected in series with a signal path of the filter circuit, or
the first BAW resonator and the second BAW resonator are parallel resonators that are connected to the signal path of the filter circuit such that one electrode of each of the BAW resonators is connected to the signal path.

2. The filter circuit according to claim 1, wherein the first piezoelectric layer of the first BAW resonator is structured such that when an electric field is applied in a spatial direction, a vibration mode with vibrations in at least two spatial directions is induced.

3. The filter circuit according to claim 1, wherein the second BAW resonator comprises a second piezoelectric layer which is unstructured or which is structured by recesses passing through the second piezoelectric layer.

4. The filter circuit according to claim 3, wherein the second piezoelectric layer of the second BAW resonator is structured such that when an electric field is applied in a spatial direction, a vibration mode with vibrations in at least two spatial directions is induced.

5. The filter circuit according to claim 3, wherein the first piezoelectric layer and the second piezoelectric layer have the same thickness.

6. The filter circuit according to claim 1, wherein the filter circuit is a ladder-type circuit or a bridge circuit.

7. The filter circuit according to claim 1, wherein the filter circuit is a bandpass filter or a bandstop filter.

8. The filter circuit according to claim 1, wherein the first BAW resonator or the second BAW resonator is a film bulk wave acoustic resonator (FBAR) or a solid mounted bulk acoustic resonator (SMR).

9. The filter circuit according to claim 1, wherein the plurality of recesses are formed by photolithographic patterning the respective piezoelectric layer.

10. The filter circuit according to claim 1, wherein the filter circuit is arranged on a chip.

11. The filter circuit according to claim 1, further comprising at least a third BAW resonator and a fourth BAW resonator, wherein the first BAW resonator and the third BAW resonator are serially connected as series resonators to the signal path of the filter circuit, wherein the second BAW resonator and the fourth BAW resonator are connected as parallel resonators to the signal path of the filter circuit in such a way that one electrode of each of the resonators is connected to the signal path, wherein the third BAW resonator comprises a third piezoelectric layer structured such that the third BAW resonator has a lower resonant frequency than the fourth BAW resonator, wherein the third piezoelectric layer is structured by recesses passing through the first piezoelectric layer.

12. The filter circuit according to claim 11, wherein the piezoelectric layers of the first BAW resonator, the second BAW resonator, the third BAW resonator and the fourth BAW resonator have the same thickness.

13. A filter circuit, comprising
a first and a second resonant bulk acoustic wave (BAW) resonator, the first BAW resonator having a first piezoelectric layer structured such that the first BAW resonator has a lower resonant frequency than the second BAW resonator, wherein the first piezoelectric layer is structured by recesses passing through the first piezoelectric layer, wherein the second resonator comprises a second piezoelectric layer which is structured by recesses passing through the second piezoelectric layer, and wherein the first piezoelectric layer has more recesses than the second piezoelectric layer, and wherein:

the first BAW resonator and the second BAW resonator are series resonators that are connected in series with a signal path of the filter circuit, or the first BAW resonator and the second BAW resonator are parallel resonators that are connected to the signal path of the filter circuit such that one electrode of each of the BAW resonators is connected to the signal path.

14. The filter circuit according to claim 13, wherein the first piezoelectric layer of the first BAW resonator is structured such that when an electric field is applied in a spatial direction, a vibration mode with vibrations in at least two spatial directions is induced.

15. The filter circuit according to claim 13, wherein the second piezoelectric layer of the second BAW resonator is structured such that when an electric field is applied in a spatial direction, a vibration mode with vibrations in at least two spatial directions is induced.

16. The filter circuit according to claim 13, wherein the first piezoelectric layer and the second piezoelectric layer have the same thickness.

17. The filter circuit according to claim 13, wherein the filter circuit is a ladder-type circuit or a bridge circuit.

18. The filter circuit according to claim 13, wherein the filter circuit is a bandpass filter or a bandstop filter.

19. The filter circuit according to claim 13, wherein the first or the second resonator is a film bulk wave acoustic resonator (FBAR) or a solid mounted bulk acoustic resonator (SMR).

20. The filter circuit according to claim 13, wherein the recesses are formed by photolithographic patterning the respective piezoelectric layer.

* * * * *